United States Patent
Son et al.

(10) Patent No.: US 10,747,101 B2
(45) Date of Patent: Aug. 18, 2020

(54) PHOTOMASK, LAMINATE COMPRISING PHOTOMASK, PHOTOMASK PREPARATION METHOD, AND PATTERN FORMING METHOD USING PHOTOMASK

(71) Applicant: LG CHEM, LTD., Seoul (KR)

(72) Inventors: Yong Goo Son, Daejeon (KR); Kiseok Lee, Daejeon (KR); Seung Heon Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 197 days.

(21) Appl. No.: 15/580,241

(22) PCT Filed: Jul. 28, 2016

(86) PCT No.: PCT/KR2016/008299
§ 371 (c)(1),
(2) Date: Dec. 6, 2017

(87) PCT Pub. No.: WO2017/018831
PCT Pub. Date: Feb. 2, 2017

(65) Prior Publication Data
US 2018/0164677 A1 Jun. 14, 2018

(30) Foreign Application Priority Data
Jul. 28, 2015 (KR) .................. 10-2015-0106833

(51) Int. Cl.
*G03F 1/48* (2012.01)
*G03F 1/38* (2012.01)

(52) U.S. Cl.
CPC . *G03F 1/48* (2013.01); *G03F 1/38* (2013.01)

(58) Field of Classification Search
CPC combination set(s) only.
See application file for complete search history.

(56) References Cited

U.S. PATENT DOCUMENTS

| | | | |
|---|---|---|---|
| 4,735,890 A | 4/1988 | Nakane | |
| 6,300,042 B1 | 10/2001 | Mancini et al. | |
| 8,648,971 B2 | 2/2014 | Ishikawa et al. | |
| 9,480,152 B2 | 10/2016 | Hong et al. | |
| 2001/0033977 A1 | 10/2001 | Itoh | |
| 2005/0100798 A1 | 5/2005 | Lin et al. | |
| 2006/0063351 A1* | 3/2006 | Jain ............... | G02F 1/1362 438/455 |
| 2006/0251972 A1 | 11/2006 | Lee | |
| 2007/0092807 A1 | 4/2007 | Fukushima et al. | |
| 2015/0118602 A1 | 4/2015 | Liou et al. | |

FOREIGN PATENT DOCUMENTS

| | | |
|---|---|---|
| CN | 1955840 | 5/2007 |
| CN | 202886836 | 4/2013 |
| JP | 05066554 | 3/1993 |
| JP | 06075358 | 3/1994 |
| JP | 2000292905 | 10/2000 |
| JP | 2001296650 | 10/2001 |
| JP | 2005003949 | 1/2006 |
| JP | 2007-140444 | 6/2007 |
| JP | 2010-107886 | 5/2010 |
| JP | 2012080078 | 4/2012 |
| JP | 5745979 | 5/2015 |
| KR | 10-2004-0024341 | 3/2004 |
| KR | 10-2006-0079957 | 7/2006 |
| KR | 10-2009-0003601 | 1/2009 |
| KR | 10-2012-0034449 | 4/2012 |
| WO | 2010014695 | 2/2010 |

* cited by examiner

*Primary Examiner* — Daborah Chacko-Davis
(74) *Attorney, Agent, or Firm* — Dentons US LLP

(57) ABSTRACT

The present specification relates to a photomask, a laminate including the photomask, a method for manufacturing the photomask and a method for forming a pattern using the photomask.

15 Claims, 3 Drawing Sheets

[FIG. 1]
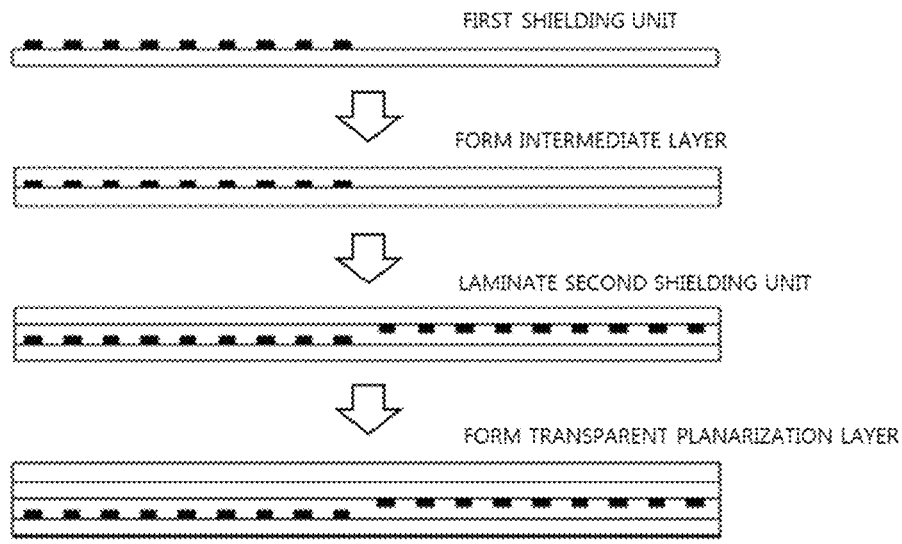
[FIG. 2]
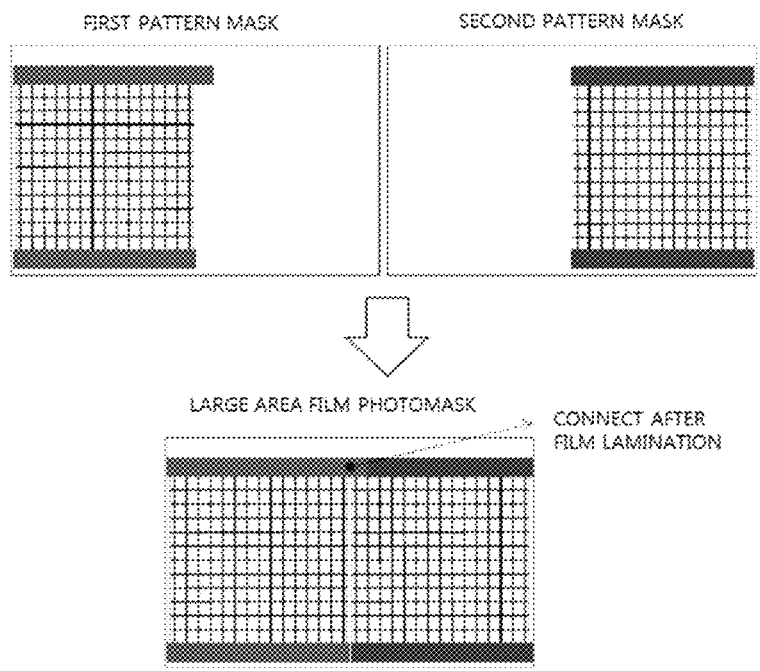

[FIG. 3]
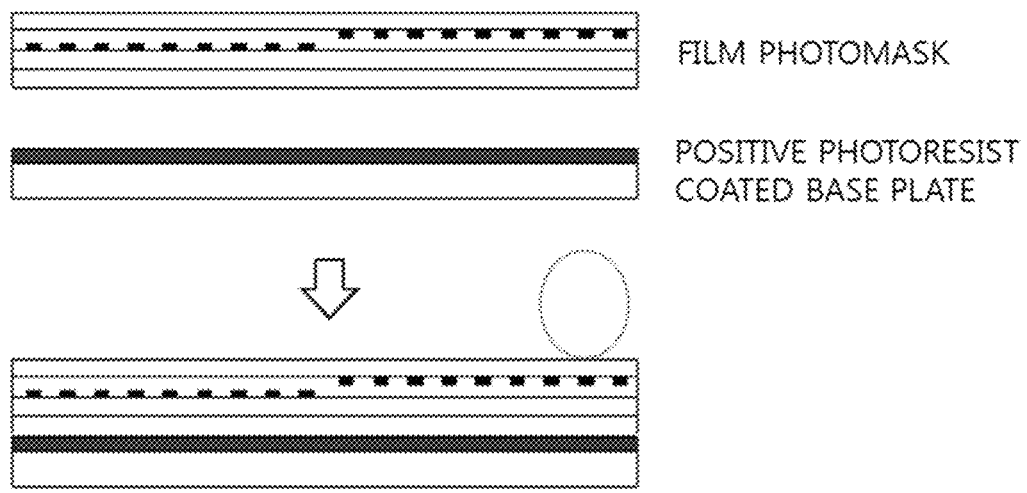
[FIG. 4]
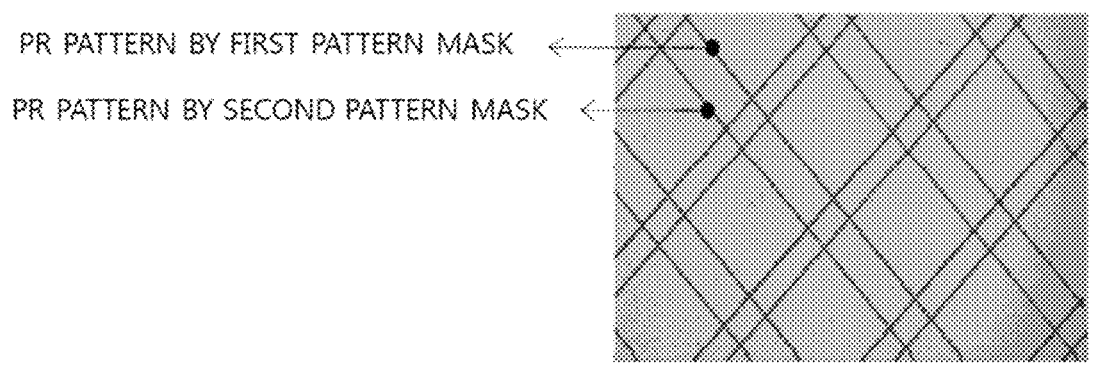

[FIG. 5]
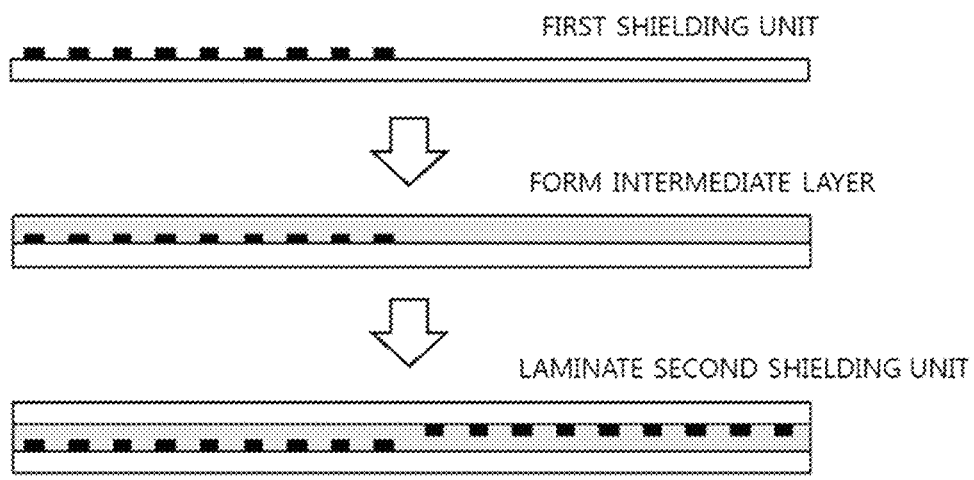
[FIG. 6]
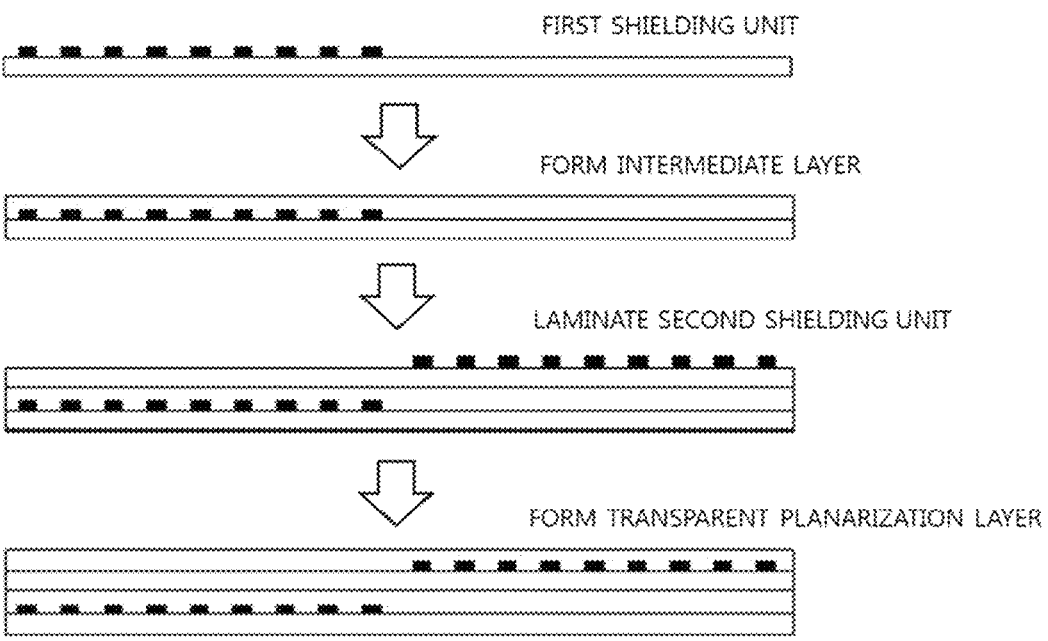

PHOTOMASK, LAMINATE COMPRISING PHOTOMASK, PHOTOMASK PREPARATION METHOD, AND PATTERN FORMING METHOD USING PHOTOMASK

TECHNICAL FIELD

This application is a National Stage Application of International Application No. PCT/KR2016/008299 filed on Jul. 28, 2016, which claims priority to and the benefits of Korean Patent Application No. 10-2015-0106833, filed with the Korean Intellectual Property Office on Jul. 28, 2015, both of which are incorporated herein in their entirety by reference for all purposes as if fully set forth herein.

The present specification relates to a photomask, a laminate comprising photomask, photomask preparing method and a pattern forming method using photomask.

BACKGROUND ART

When forming a pattern of a display apparatus, a photolithography method using a photomask is often used among methods forming a pattern on a substrate.

The photolithography method refers to all processes uniformly coating a photoresist on a base plate, exposing a pattern on a photomask using an exposure apparatus and the photomask, and then going through developing and post bake processes to form a target pattern.

When the photoresist layer is a positive resist layer, chemical changes occur in the resist layer material in the exposed region, and the material may fell off from the resist layer during the development. Meanwhile, when the photoresist layer is a negative resist layer, a material that is not exposed falls off during the development.

Herein, the photolithography method forms a resist pattern with a fixed shape on a resist film by disposing a mask pattern-formed permeable substrate as a photomask and irradiating light on the photomask.

DISCLOSURE

Technical Problem

The present specification is directed to providing a photomask, a laminate including the photomask, a method for manufacturing the photomask and a method for forming a pattern using the photomask.

Technical Solution

One embodiment of the present specification provides a photomask including a first unit including a first shielding mask pattern provided on a first substrate; a second unit including a second shielding mask pattern provided on a second substrate; an intermediate layer located between a surface of the first unit provided with the first shielding mask pattern and a surface of the second unit provided with the second shielding mask pattern; and a transparent planarization layer located on a surface of the second unit opposite to the surface provided with the intermediate layer.

Another embodiment of the present specification provides a laminate including an exposure target including a photoresist layer provided on a base plate; and a photomask including a first unit including a first shielding mask pattern provided on a first substrate, a second unit including a second shielding mask pattern provided on a second substrate, an intermediate layer located between a surface of the first unit provided with the first shielding mask pattern and a surface of the second unit provided with the second shielding mask pattern, and a transparent planarization layer located on a surface of the second unit opposite to the surface provided with the intermediate layer, wherein the photoresist layer of the exposure target is in contact with the transparent planarization layer of the photomask.

Still another embodiment of the present specification provides a method for manufacturing a photomask including preparing a first unit including a first shielding mask pattern provided on a first substrate and a second unit including a second shielding mask pattern provided on a second substrate; forming an intermediate layer on a surface of the first unit provided with the first shielding mask pattern and then laminating the second unit on the intermediate layer; and forming a transparent planarization layer on a surface of the second unit opposite to the surface provided with the intermediate layer.

Yet another embodiment of the present specification provides a method for forming a pattern including preparing an exposure target including a photoresist layer provided on a base plate; laminating so that the photoresist layer of the exposure target is in contact with the transparent planarization layer of the photomask, which including a first unit including a first shielding mask pattern provided on a first substrate, a second unit including a second shielding mask pattern provided on a second substrate, an intermediate layer located between a surface of the first unit provided with the first shielding mask pattern and a surface of the second unit provided with the second shielding mask pattern, and a transparent planarization layer located on a surface of the second unit opposite to the surface provided with the intermediate layer; exposing by irradiating light from a side of the first substrate of the photomask; and separating the photomask from the exposure target after the exposing.

Advantageous Effects

With a photomask according to the present specification, a large area or wide photomask can be manufactured.

By using a transparent planarization layer, the photomask according to the present specification is capable of preventing contamination caused by a contact between a photoresist layer of an exposure target and a shielding pattern layer.

DESCRIPTION OF DRAWINGS

FIG. 1 is a flow chart illustrating a method for manufacturing a photomask according to one embodiment of the present specification.

FIG. 2 is a plane figure illustrating a shielding mask pattern of a photomask according to one embodiment of the present specification.

FIG. 3 is a flow chart illustrating a method for forming a pattern using a photomask according to one embodiment of the present specification.

FIG. 4 is a pattern image prepared using a photomask according to one embodiment of the present specification.

FIG. 5 is a flow chart illustrating a method for manufacturing a photomask of Comparative Example 1.

FIG. 6 is a flow chart illustrating a method for manufacturing a photomask of Comparative Example 2.

MODE FOR DISCLOSURE

Hereinafter, the present specification will be described in detail.

One embodiment of the present specification provides a photomask including a first unit including a first shielding mask pattern provided on a first substrate; a second unit including a second shielding mask pattern provided on a second substrate; an intermediate layer located between a surface of the first unit provided with the first shielding mask pattern and a surface of the second unit provided with the second shielding mask pattern; and a transparent planarization layer located on a surface of the second unit opposite to the surface provided with the intermediate layer.

The first unit may include a first shielding mask pattern provided on a first substrate, and the second unit may include a second shielding mask pattern provided on a second substrate.

Materials of the first substrate and the second substrate are not particularly limited, however, those having favorable adhesion with the shielding mask pattern and the intermediate layer, and as a substrate of a photomask, those having a minimum influence on light penetrating the photomask are preferred.

The first substrate and the second substrate may each be a hard substrate or a flexible substrate. Specifically, the flexible substrate may be a plastic substrate or a plastic film. The plastic substrate or the plastic film is not particularly limited, and examples thereof may include any one or more of polyacrylate, polypropylene (PP), polyethylene terephthalate (PET), polyethylene ether phthalate, polyethylene phthalate, polybuthylene phthalate, polyethylene naphthalate (PEN), polycarbonate (PC), polystyrene (PS), polyether imide, polyether sulfone, polydimethyl siloxane (PDMS), polyetheretherketone (PEEK) and polyimide (PI).

As the first substrate and the second substrate, substrates having high transparency may be used, and light transmittance of the first substrate and the second substrate may be 50% or greater.

A difference between the refractive index of each of the first substrate and the second substrate, and the refractive index of the intermediate layer is preferably small, and the refractive indexes of the first substrate and the second substrate may each be greater than or equal to 1.45 and less than or equal to 1.65.

The first substrate and the second substrate may be formed with materials the same as or different from each other, however, the first substrate and the second substrate are preferably formed with the same material.

A part of the first shielding mask pattern of the first unit may overlap with the second shielding mask pattern of the second unit, or the first shielding mask pattern of the first unit may not overlap with the second shielding mask pattern of the second unit. Specifically, a part of the first shielding mask pattern of the first unit may overlap with the second shielding mask pattern of the second unit.

As illustrated in FIG. 2, a part of the first shielding mask pattern of the first unit may overlap with the second shielding mask pattern of the second unit.

The surface of the first unit provided with the first shielding mask pattern and the surface of the second unit provided with the second shielding mask pattern may face each other. As illustrated in FIG. 1, the surface of the first unit provided with the first shielding mask pattern and the surface of the second unit provided with the second shielding mask pattern may face each other.

The intermediate layer is located between the surface of the first unit provided with the first shielding mask pattern and the surface of the second unit provided with the second shielding mask pattern, preferably has adhesive strength capable of adhering the first unit and the second unit, and has a minimum influence on light penetrating the photomask.

The intermediate layer may include a silicone-based resin, specifically may include a siloxane-based resin, and more specifically may include polydimethylsiloxane (PDMS).

The intermediate layer may have a thickness of greater than or equal to 1 µm and less than or equal to 500 µm, however, the thickness is not limited thereto.

The transparent planarization layer is located on a surface of the second unit opposite to the surface provided with the intermediate layer, and the surface of the second unit opposite to the surface provided with the intermediate layer is a flat layer. Of the transparent planarization layer, surface roughness (Ra) representing a degree of planarization of the surface of the second unit opposite to the surface provided with the intermediate layer is preferably greater than or equal to 0.1 nm and less than or equal to 20 nm.

As the transparent planarization layer, those that are not shielded by the shielding mask pattern and having a minimum influence on light penetrating the photomask are preferred. Materials having high transparency may be used as the transparent planarization layer, and the transparent planarization layer may have light transmittance of 50% or greater.

Differences between the refractive index of the transparent planarization layer and the refractive indexes of the first substrate, the second substrate and the intermediate layer are preferably small, and the refractive index of the transparent planarization layer may be greater than or equal to 1.43 and less than or equal to 1.49.

The transparent planarization layer may have a thickness of greater than or equal to 1 µm and less than or equal to 500 µm. Specifically, the transparent planarization layer may have a thickness of greater than or equal to 1 µm and less than or equal to 50 µm.

The transparent planarization layer preferably has an excellent coating property so as to form a flat layer, has high light transmittance, and has adhesive and releasing properties so as to be attached to and separated from surfaces of other materials.

The transparent planarization layer may include a silicone-based resin, specifically, may include a siloxane-based resin, and more specifically, may include polydimethylsiloxane (PDMS).

The transparent planarization layer may include a silicone-based resin the same as or different from the intermediate layer. The transparent planarization layer preferably includes the same silicone-based resin as the intermediate layer.

Another embodiment of the present specification provides a laminate including an exposure target including a photoresist layer provided on a base plate; and a photomask including a first unit including a first shielding mask pattern provided on a first substrate, a second unit including a second shielding mask pattern provided on a second substrate, an intermediate layer located between a surface of the first unit provided with the first shielding mask pattern and a surface of the second unit provided with the second shielding mask pattern, and a transparent planarization layer located on a surface of the second unit opposite to the surface provided with the intermediate layer, wherein the photoresist layer of the exposure target is in contact with the transparent planarization layer of the photomask.

Materials of the base plate are not particularly limited, however, the base plate may be a hard material or a soft material.

The hard material may include glass, metals, hard plastics or thick plastics.

The soft material may include soft plastics or thin plastics.

The base plate may have a thickness of greater than or equal to 15 μm and less than or equal to 2 mm, however, the thickness is not limited thereto.

The photoresist layer (PR) means a layer including a polymer with varying tolerance for a developing solution by being exposed to light, and the photoresist layer may be a positive photoresist layer or a negative photoresist layer. Specifically, the photoresist layer is preferably a positive photoresist layer.

The photoresist layer may have a thickness of greater than or equal to 100 nm and less than or equal to 10 μm, however, the thickness is not limited thereto.

The exposure target may further include a metal layer provided between the base plate and the photoresist layer.

Materials of the metal layer are not particularly limited, however, the metal layer may be formed with at least one of copper (Cu), chromium (Cr), aluminum (Al), molybdenum (Mo), nickel (Ni), gold (Au) and silver (Ag).

As for the descriptions on the photomask in the laminate, the description on the photomask provided above may be used.

One embodiment of the present specification provides a method for manufacturing a photomask including preparing a first unit including a first shielding mask pattern provided on a first substrate and a second unit including a second shielding mask pattern provided on a second substrate; forming an intermediate layer on a surface of the first unit provided with the first shielding mask pattern and then laminating the second unit on the intermediate layer; and forming a transparent planarization layer on a surface of the second unit opposite to the surface provided with the intermediate layer.

The method for manufacturing a photomask may include preparing a first unit including a first shielding mask pattern provided on a first substrate and a second unit including a second shielding mask pattern provided on a second substrate.

The method of forming a first shielding mask pattern and a second shielding mask pattern on a first substrate and a second substrate, respectively, may each be inkjet printing, gravure printing, gravure offset printing, screen printing, reverse offset printing, and photolithography. Specifically, the method of forming a first shielding mask pattern and a second shielding mask pattern on a first substrate and a second substrate, respectively, may be photolithography, and after depositing shielding mask metals on a substrate and forming an etching resist pattern, the metals in a region that is not provided with the etching resist pattern are selectively removed through an etching process, and lastly, the etching resist pattern on the shielding mask pattern is peeled off to form the shielding mask pattern.

As for descriptions on the first unit and the second unit, the descriptions provided above may be used.

The method for manufacturing a photomask may include forming an intermediate layer on a surface of the first unit provided with the first shielding mask pattern and then laminating the second unit on the intermediate layer.

The method of forming an intermediate layer may include coating a composition for forming an intermediate layer on a surface of the first unit provided with the first shielding mask pattern, and then drying and curing the composition.

The laminating of the second unit on the intermediate layer may be laminating so that the second substrate of the second unit is in contact with the intermediate layer thereon, or laminating so that a surface of the second substrate of the second unit provided with the second shielding mask pattern is in contact with the intermediate layer thereon. Specifically, the laminating of the second unit on the intermediate layer is preferably laminating so that a surface of the second substrate of the second unit provided with the second shielding mask pattern is in contact with the intermediate layer thereon. In other words, the surface of the first unit provided with the first shielding mask pattern and the surface of the second unit provided with the second shielding mask pattern preferably face each other.

The method for manufacturing a photomask may include forming a transparent planarization layer on a surface of the second unit opposite to the surface provided with the intermediate layer.

The forming of a transparent planarization layer may include coating a composition for forming a transparent planarization layer on a surface of the second unit opposite to the surface provided with the intermediate layer; and drying and curing the composition. Herein, as the methods of coating, drying and curing may employ methods generally used in the art.

The composition for forming a transparent planarization layer may include a silicone-based resin, specifically, may include a siloxane-based resin, and more specifically, include polydimethylsiloxane (PDMS).

The composition for forming an intermediate layer and the composition for forming a transparent planarization layer may each include a silicone-based resin, and the composition for forming an intermediate layer may include a silicone-based resin the same as or different from the composition for forming a transparent planarization layer. The composition for forming an intermediate layer preferably includes the same silicone-based resin with the composition for forming a transparent planarization layer.

The composition for forming an intermediate layer and the composition for forming a transparent planarization layer may each further include a curing agent. The curing agent is not particularly limited, and materials generally used in the art may be selected.

One embodiment of the present specification provides a method for forming a pattern including preparing an exposure target including a photoresist layer provided on a base plate; laminating so that the photoresist layer of the exposure target is in contact with, in a photomask including a first unit including a first shielding mask pattern provided on a first substrate, a second unit including a second shielding mask pattern provided on a second substrate, an intermediate layer located between a surface of the first unit provided with the first shielding mask pattern and a surface of the second unit provided with the second shielding mask pattern, and a transparent planarization layer located on a surface of the second unit opposite to the surface provided with the intermediate layer, the transparent planarization layer of the photomask; exposing by irradiating light from a side of the first substrate of the photomask; and separating the photomask from the exposure target after the exposing.

In the method for forming a pattern, descriptions duplicated with the descriptions provided above will not be repeated, and these may cite the descriptions provided above.

The method for forming a pattern may further include forming a photoresist pattern by developing the exposed exposure target after separating the photomask.

The method of developing the exposed exposure target may include forming a photoresist pattern by coating a developing solution on the exposed exposure target, or forming a photoresist pattern by immersing the exposed exposure target into a developing solution.

When the exposure target further includes a metal layer provided between the base plate and the photoresist layer, the method for forming a pattern may further include forming a photoresist pattern by developing the exposed exposure target after separating the photomask; and forming a metal pattern by etching a part of the metal layer where the photoresist pattern is not formed.

The forming of a metal pattern may include etching a part of the metal layer where the photoresist pattern is not formed; and removing the photoresist pattern after etching the metal layer.

Hereinafter, the present specification will be described in more detail with reference to example. However, the following examples are for illustrative purposes only, and not to limit the present specification.

EXAMPLE

Example 1

Manufacture of Film Photomask

On a surface of a first unit provided with a first shielding mask pattern having a size of 500 mm×500 mm, a silicone-based resin composition was coated to a thickness of 100 μm using a baker applicator, and the result was dried for 10 minutes at 70° C. to finally form an intermediate layer having a thickness of 30 μm. As the silicone-based resin composition, a composition mixing a main substance (product name KE-1606) and a curing agent (product name CAT-RG) manufactured by Shin-Etsu Chemical Co., Ltd. in a ratio of 10:1.5 was used.

On the intermediate layer, a surface of a second unit provided with a second shielding mask pattern having a size of 500 mm×500 mm was laminated so as to face each other.

As the first unit and the second unit, an aluminum (Al) mesh pattern having a line width of 10 μm, line spacing of 300 μm and a line height of 100 nm was provided on a PET base plate having a thickness of 100 μm.

On a surface of the second unit opposite to the surface provided with the intermediate layer, the silicone-based resin composition was coated to a thickness of 100 μm using a baker applicator, the result was dried and thermally cured for 10 minutes at 100° C. to finally form a transparent planarization layer having a thickness of 30 μm, and a film photomask as in FIG. 1 was manufactured.

Exposure Target Preparation and Patterning

On a PET base plate having a thickness of 100 μm, a positive photoresist formed with a novolac resin and a diazonaphthoquinone derivative was coated to a thickness of 1.5 μm using a slot die coater.

The manufactured film photomask and the exposure target were laminated as in FIG. 3 using a roll laminator.

After exposing the laminated laminate using a parallel light exposure apparatus provided with a collimation lens, the film photomask was separated from the exposure target, and the exposure target was immersed in a developing solution having a 2.38 wt % tetramethyl ammonium hydroxide (TMAH) concentration for 50 seconds to form a photoresist pattern.

Example 2

A film photomask was manufactured in the same manner as in Example 1 except that the mesh patterns of the first unit and the second unit were disposed so as to overlap as in FIG. 4, and a photoresist pattern was formed on the exposure target using the manufactured film photomask.

As a result, it was seen that line widths of the photoresist pattern formed by the first shielding mask pattern of the first unit and the photoresist pattern formed by the second shielding mask pattern of the second unit were the same as in FIG. 4.

Comparative Example 1

A film photomask was manufactured in the same manner as in the examples except that the transparent planarization layer was not formed, and a structure of Comparative Example 1 is illustrated in FIG. 5.

When using Comparative Example 1, lifting occurred when the photomask and the photoresist of the printing target were brought into contact with each other, and surface contamination occurred.

Comparative Example 2

A film photomask was manufactured in the same manner as in the examples except that the intermediate layer was formed on a surface of the second unit opposite to the surface provided with the shielding pattern, and a structure of Comparative Example 2 is illustrated in FIG. 6.

When using Comparative Example 2, it was seen that line widths of the photoresist pattern formed by the first shielding pattern and the photoresist pattern formed by the second shielding pattern became different.

The invention claimed is:

1. A photomask comprising:
   a first unit having a surface including a first shielding mask pattern provided on a first substrate;
   an intermediate layer on the surface including the first shielding mask pattern;
   a second unit provided on the intermediate layer and having a first surface including a second shielding mask pattern provided on a second substrate and a second surface opposite the first surface, wherein the intermediate layer is in contact with the first surface including the second shielding pattern; and
   a transparent planarization layer located on the second surface of the second unit,
   wherein:
   the intermediate layer and the transparent planarization layer each include the same siloxane-based resin; and
   the first substrate and the second substrate each is a flexible substrate.

2. The photomask of claim 1, wherein a part of the first shielding mask pattern of the first unit overlaps with the second shielding mask pattern of the second unit.

3. The photomask of claim 1, wherein the first shielding mask pattern of the first unit does not overlap with the second shielding mask pattern of the second unit.

4. A laminate comprising:
   an exposure target including a photoresist layer provided on a base plate; and
   the photomask of claim 1,
   wherein the photoresist layer of the exposure target is in contact with the transparent planarization layer of the photomask.

5. The laminate of claim 4, wherein the photoresist layer is a positive photoresist layer.

6. The laminate of claim 4, wherein the exposure target further includes a metal layer provided between the base plate and the photoresist layer.

7. The laminate of claim 4, wherein a part of the first shielding mask pattern of the first unit overlaps with the second shielding mask pattern of the second unit.

8. The laminate of claim 4, wherein the first shielding mask pattern of the first unit does not overlap with the second shielding mask pattern of the second unit.

9. The laminate of claim 4, wherein the surface of the first unit provided with the first shielding mask pattern and the first surface of the second unit provided with the second shielding mask pattern face each other.

10. A method for forming a pattern comprising:
preparing an exposure target including a photoresist layer provided on a base plate;
laminating so that the photoresist layer of the exposure target is in contact with the transparent planarization layer of the photomask of claim 1;
exposing by irradiating light from a side of the first substrate of the photomask; and
separating the photomask from the exposure target after the exposing.

11. The method for forming a pattern of claim 10, further comprising forming a photoresist pattern by developing the exposed exposure target after the separating of the photomask.

12. The method for forming a pattern of claim 10, wherein the exposure target further includes a metal layer provided between the base plate and the photoresist layer.

13. The method for forming a pattern of claim 12, further comprising:
forming a photoresist pattern by developing the exposed exposure target after the separating of the photomask; and
forming a metal pattern by etching a part of the metal layer where the photoresist pattern is not formed.

14. A method for manufacturing a photomask comprising:
preparing a first unit including a surface having a first shielding mask pattern provided on a first substrate;
preparing a second unit including a first surface having a second shielding mask pattern and a second surface opposite to the first surface provided on a second substrate;
forming an intermediate layer on the surface of the first unit having the first shielding mask pattern;
laminating the second unit on the intermediate layer so that the first surface having the second shielding mask pattern is in contact with the intermediate layer; and
forming a transparent planarization layer on the second surface of the second unit that is not in contact with the intermediate layer,
wherein:
the intermediate layer and the transparent planarization layer each include the same siloxane-based resin; and
the first substrate and the second substrate each is a flexible substrate.

15. The method for manufacturing a photomask of claim 14, wherein the surface of the first unit provided with the first shielding mask pattern and the first surface of the second unit provided with the second shielding mask pattern face each other.

* * * * *